United States Patent
Hsu et al.

(10) Patent No.: US 9,310,869 B2
(45) Date of Patent: Apr. 12, 2016

(54) MEMORY STORAGE DEVICE, MEMORY CONTROL CIRCUIT UNIT AND POWER SUPPLY METHOD

(71) Applicant: PHISON ELECTRONICS CORP., Miaoli (TW)

(72) Inventors: Chih-Jen Hsu, Hsinchu County (TW); Hsiang-Hsiung Yu, Hsinchu County (TW); Ta-Chuan Wei, Miaoli County (TW); Yun-Chieh Chen, Miaoli County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 24 days.

(21) Appl. No.: 14/462,569

(22) Filed: Aug. 19, 2014

(65) Prior Publication Data

US 2015/0323969 A1    Nov. 12, 2015

(30) Foreign Application Priority Data

May 6, 2014 (TW) .............................. 103116070 A
Jun. 13, 2014 (TW) .............................. 103120567 A (51) Int. Cl.
 G11C 16/30 (2006.01)
 G06F 1/26 (2006.01)
 G06F 13/42 (2006.01)

(52) U.S. Cl.
 CPC ............ *G06F 1/266* (2013.01); *G06F 13/4221* (2013.01); *G11C 16/30* (2013.01)

(58) Field of Classification Search
 CPC .. G11C 5/14; G11C 11/1697; G11C 11/2297; G11C 13/0038; G11C 16/30
 See application file for complete search history.

(56) References Cited

U.S. PATENT DOCUMENTS

| | | | | |
|---|---|---|---|---|
| 5,469,399 A | * | 11/1995 | Sato ....................... | G11C 5/145 327/530 |
| 6,982,919 B2 | * | 1/2006 | Kumahara ............. | G11C 16/30 365/185.22 |
| 2007/0291569 A1 | * | 12/2007 | Hsieh ..................... | G11C 16/30 365/226 |
| 2008/0080254 A1 | * | 4/2008 | Kagan .................... | G11C 5/145 365/185.23 |
| 2008/0089125 A1 | * | 4/2008 | Micheloni ............. | G11C 16/08 365/185.05 |
| 2008/0198657 A1 | * | 8/2008 | Kim ........................ | G11C 5/14 365/185.18 |
| 2015/0179234 A1 | * | 6/2015 | Kawase ................ | G11C 5/148 365/185.08 |

* cited by examiner

*Primary Examiner* — Khamdan Alrobaie
(74) *Attorney, Agent, or Firm* — Jianq Chyun IP Office (57) ABSTRACT

A memory storage device, a memory control circuit unit and a power supply method are provided. The power supply method includes: providing a first power voltage to a host interface circuit of the memory storage device; providing a second power voltage to a memory management circuit of the memory storage device; providing a third power voltage to a memory interface circuit of the memory storage device, wherein a reference voltage terminal of the memory interface circuit is coupled to a power input terminal of the memory management circuit. Thus, the overheat problem of the memory storage device due to the voltage conversion may be improved.

22 Claims, 6 Drawing Sheets

MEMORY STORAGE DEVICE, MEMORY CONTROL CIRCUIT UNIT AND POWER SUPPLY METHOD

CROSS-REFERENCE TO RELATED APPLICATION

This application claims the priority benefit of Taiwan application serial no. 103116070, filed on May 6, 2014, and Taiwan application serial no. 103120567, filed on Jun. 13, 2014. The entirety of each of the above-mentioned patent applications is hereby incorporated by reference herein and made a part of this specification.

BACKGROUND

1. Technical Field

The invention relates to a memory storage device, and more particularly, relates to a memory storage device, a memory control circuit unit and a power supply method.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multimedia devices as cited above.

The power supplied to the memory storage device mainly came from city power or batteries. The power came from city power or batteries is first processed by step-down and/or rectification of a step-down and/or rectification circuit before being provided to electronic components or circuits in the memory storage device. However, in case a larger adjustment is made to the voltage by the voltage lowering and/or rectifying circuit, a large amount of heat may be generated to increase temperature of the memory storage device.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

The invention is directed to a memory storage device, a memory control circuit unit and a power supply method, and capable of improving the overheat problem of the memory storage device due to the voltage conversion in conventional art.

A memory storage device is provided according to an exemplary embodiment of the invention, which includes a connection interface unit, a rewritable non-volatile memory module and a memory control circuit unit. The connection interface unit is configured to couple to a host system. The rewritable non-volatile memory module includes a plurality of physical erasing units. The memory control circuit unit is coupled to the connection interface unit and the rewritable non-volatile memory module, and includes a host interface circuit, a memory management circuit, a memory interface circuit and a power supply module. The host interface circuit is configured to couple to the host system. The memory interface circuit is configured to couple to the rewritable non-volatile memory module. The power supply module is coupled to the host interface circuit, the memory management circuit and the memory interface circuit. Therein, the power supply module is configured to provide a first power voltage to a power input terminal of the host interface circuit. The power supply module is further configured to provide a second power voltage to a power input terminal of the memory management circuit. The power supply module is further configured to provide a third power voltage to a power input terminal of the memory interface circuit. Therein, a reference voltage terminal of the memory interface circuit is coupled to the power input terminal of the memory management circuit, and voltage values of the first power voltage, the second power voltage and the third power voltage are different from one another.

A memory control circuit unit for controlling a rewritable non-volatile memory module is provided according to an exemplary embodiment of the invention, in which the rewritable non-volatile memory module has a plurality of physical erasing units. The memory control circuit unit includes a host interface circuit, a memory management circuit, a memory interface circuit and a power supply module. The host interface circuit is configured to couple to a host system. The memory interface circuit is configured to couple to the rewritable non-volatile memory module. The power supply module is coupled to the host interface circuit, the memory management circuit and the memory interface circuit. Therein, the power supply module is configured to provide a first power voltage to a power input terminal of the host interface circuit. The power supply module is further configured to provide a second power voltage to a power input terminal of the memory management circuit. The power supply module is further configured to provide a third power voltage to a power input terminal of the memory interface circuit. Therein, a reference voltage terminal of the memory interface circuit is coupled to the power input terminal of the memory management circuit, and voltage values of the first power voltage, the second power voltage and the third power voltage are different from one another.

A power supply method for a memory storage device is provided according to an exemplary embodiment of the invention, and the memory storage device includes a rewritable non-volatile memory module having a plurality of physical erasing units. The power supply method includes: providing a first power voltage to a power input terminal of a host interface circuit of the memory storage device; providing a second power voltage to a power input terminal of a memory management circuit of the memory storage device; and providing a third power voltage to a power input terminal of a memory interface circuit of the memory storage device. Therein, a reference voltage terminal of the memory interface circuit is coupled to the power input terminal of the memory management circuit, and voltage values of the first power voltage, the second power voltage and the third power voltage are different from one another.

Based on above, in the memory storage device, the memory control circuit unit and the power supply method provided by the invention, by directing the output current of the memory interface circuit into the memory management circuit, the normal operations of the memory interface circuit and the memory management circuit may be maintained while improving the overheat problem of the memory storage device due to the voltage conversion in conventional art.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Exemplary embodiments are provided below to describe the invention in detail, though the invention is not limited to the provided exemplary embodiments, and the provided exemplary embodiments can be suitably combined. The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means". In addition, the term "signal" can mean a current, a voltage, a charge, a temperature, data or any one or multiple signals.

Generally, a memory storage device (a.k.a. the memory storage system) includes a rewritable non-volatile memory module and a controller (a.k.a. the control circuit). The memory storage device is usually configured together with a host system so that the host system may write data to or read data from the memory storage device.

Figure 1:
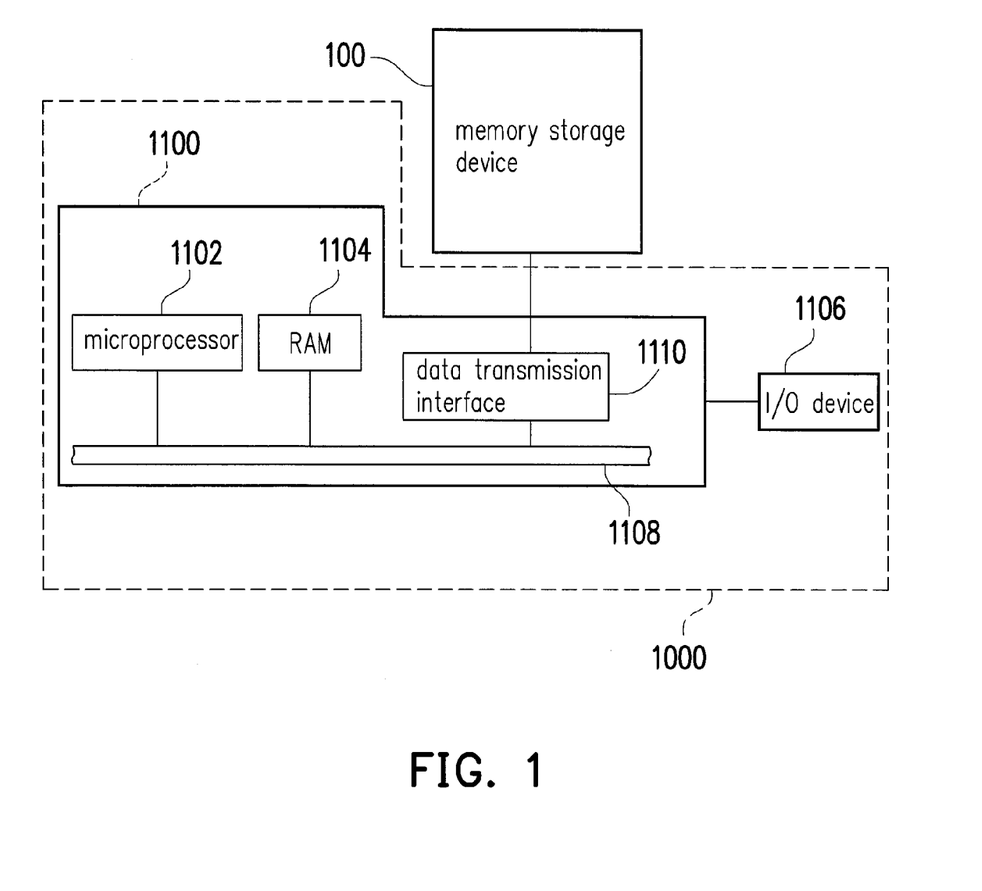
FIG. 1 illustrates a host system and a memory storage device according to an exemplary embodiment of the invention.
Figure 2:
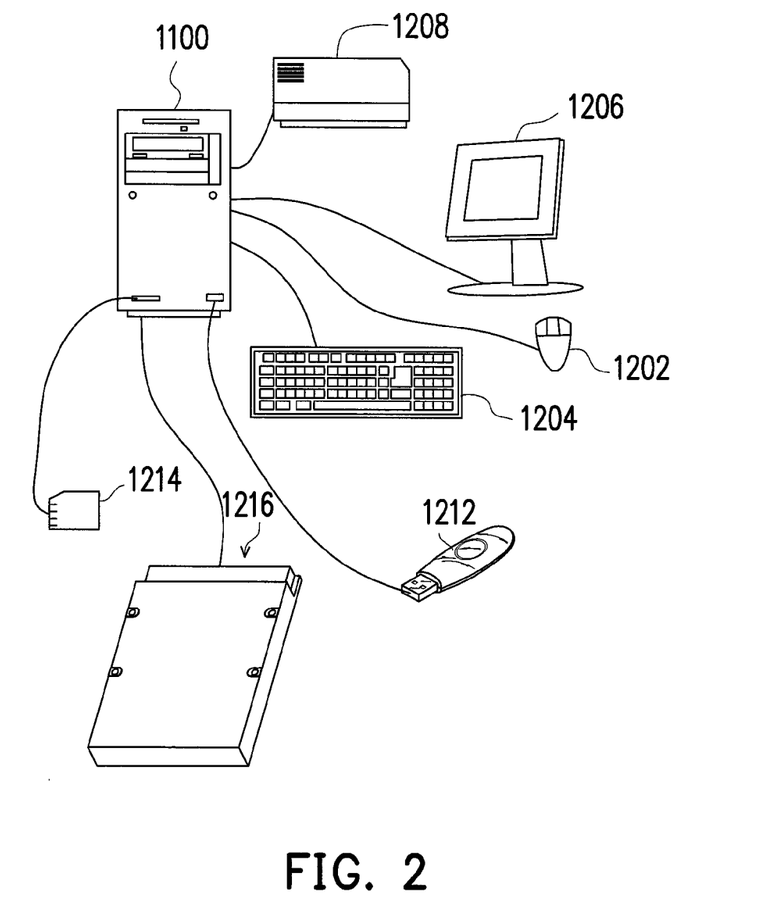
FIG. 2 is a schematic diagram illustrating a host system and an input/output device according to an exemplary embodiment of the invention.
Figure 3:
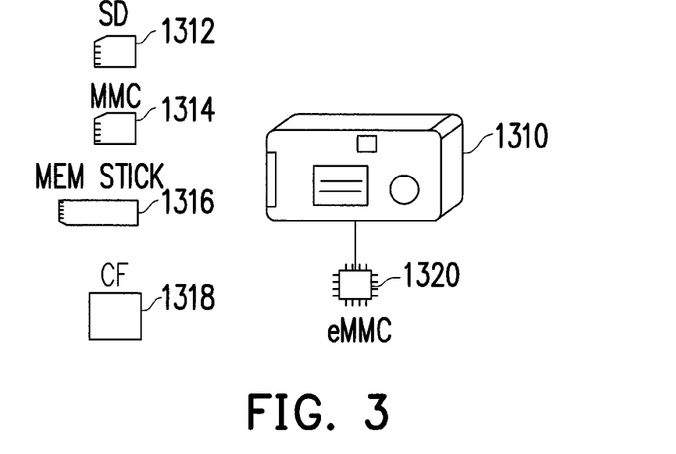
FIG. 3 is a schematic diagram illustrating a host system and a memory storage device according to an exemplary embodiment of the invention.

FIG. 1 is a schematic diagram illustrating a host system and a memory storage device according to an exemplary embodiment of the invention. FIG. 2 is a schematic diagram illustrating a host system and an input/output device according to an exemplary embodiment of the invention. FIG. 3 is a schematic diagram illustrating a host system and a memory storage device according to an exemplary embodiment of the invention.

Referring to FIG. 1, a host system 1000 includes a computer 1100 and an input/output (I/O) device 1106. The computer 1100 includes a microprocessor 1102, a random access memory (RAM) 1104, a system bus 1108, and a data transmission interface 1110. For example, the I/O device 1106 includes a mouse 1202, a keyboard 1204, a display 1206 and a printer 1208 as shown in FIG. 2. It should be understood that the devices illustrated in FIG. 2 are not intended to limit the I/O device 1106, and the I/O device 1106 may further include other devices.

In an exemplary embodiment, the memory storage device 100 is coupled to other devices of the host system 1000 through the data transmission interface 1110. By using the microprocessor 1102, the random access memory 1104 and the Input/Output (I/O) device 1106, data may be written into the memory storage device 100 or may be read from the memory storage device 100. For example, the memory storage device 100 may be a rewritable non-volatile memory storage device such as a flash drive 1212, a memory card 1214, or a solid state drive (SSD) 1216 as shown in FIG. 2.

Generally, the host system 1000 may substantially be any system capable of storing data with the memory storage device 100. Although the host system 1000 is described as a computer system in the present exemplary embodiment, in another exemplary embodiment, the host system 1000 may be a digital camera, a video camera, a telecommunication device, an audio player, or a video player. For example, when the host system is a digital camera (video camera) 1310, the rewritable non-volatile memory storage device may be a SD card 1312, a MMC card 1314, a memory stick (MS) 1316, a CF card 1318 or an embedded storage device 1320 (as shown in FIG. 3). The embedded storage device 1320 includes an embedded MMC (eMMC). It should be mentioned that the eMMC is directly coupled to a substrate of the host system.

Figure 4:
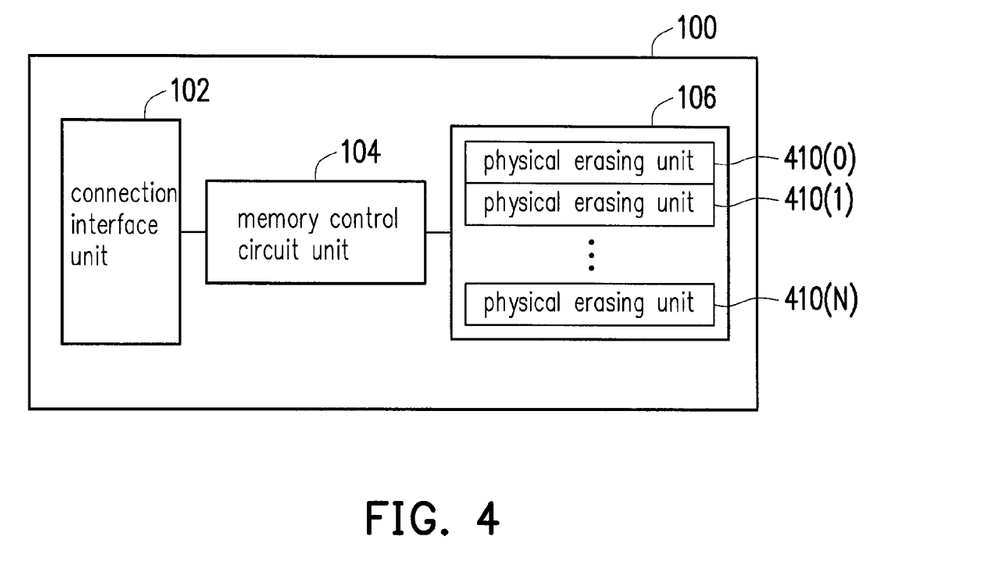
FIG. 4 is a schematic block diagram illustrating the memory storage device in FIG. 1.

FIG. 4 is a schematic block diagram illustrating the memory storage device in FIG. 1.

Referring to FIG. 4, the memory storage device 100 includes a connection interface unit 102, a memory control circuit unit 104 and a rewritable non-volatile memory module 106.

In the present exemplary embodiment, the connection interface unit 102 is compatible with a serial advanced technology attachment (SATA) standard. However, the invention is not limited thereto, and the connection interface unit 102 may also be compatible to Parallel Advanced Technology Attachment (PATA) standard, Institute of Electrical and Electronic Engineers (IEEE) 1394 standard, Peripheral Component Interconnect (PCI) Express interface standard, Universal Serial Bus (USB) standard, Ultra High Speed-I (UHS-I) interface standard, Ultra High Speed-II (UHS-II) interface standard, Secure Digital (SD) interface standard, Memory Stick (MS) interface standard, Multi Media Card (MMC) interface standard, Compact Flash (CF) interface standard, Integrated Device Electronics (IDE) interface standard or other suitable standards. In the present exemplary embodiment, the connection interface unit 102 and the memory control circuit unit 104 may be packaged into one chip, or distributed outside of a chip containing the memory control circuit unit 104.

The memory control circuit unit 104 is configured to execute a plurality of logic gates or control commands which are implemented in a hardware form or in a firmware form, so as to perform operations of writing, reading or erasing data in the rewritable non-volatile memory module 106 according to the commands of the host system 1000.

The rewritable non-volatile memory module 106 is coupled to the memory control circuit unit 104 and configured to store data written from the host system 1000. The rewritable non-volatile memory module 106 includes multiple physical erasing units 410(0) to 410(N). For example, the physical erasing units 410(0) to 410(N) may belong to the same memory die or belong to different memory dies. Each physical erasing unit has a plurality of physical programming units, and the physical programming units of the same physical erasing unit may be written separately and erased simultaneously. For example, each physical erasing unit is composed by 128 physical programming units. Nevertheless, it should be understood that the invention is not limited thereto. Each physical erasing unit is composed by 64 physical programming units, 256 physical programming units or any amount of the physical programming units.

More specifically, each of the physical programming units includes a plurality of word lines and a plurality of bit lines, and a memory cell is disposed at an intersection of each of the word lines and each of the data lines. Each memory cell can store one or more bits. All of the memory cells in the same physical erasing unit are erased together. In the present exemplary embodiment, the physical erasing unit is a minimum unit for erasing. Namely, each physical erasing unit contains the least number of memory cells to be erased together. For instance, the physical erasing unit is a physical block. Furthermore, the memory cells on the same word line constitute one or more of the physical programming units. In case each of the memory cells may store two or more bits, the physical programming units on the same word line may be classified into a lower physical programming unit and an upper physical programming unit. Generally, a writing speed of the lower physical programming unit is faster than a writing speed of the upper physical programming unit. In the present exemplary embodiment, the physical programming unit is a minimum unit for programming. That is, the physical programming unit is the minimum unit for writing data. For example, the physical programming unit is a physical page or a physical sector. In case the physical programming unit is the physical page, each physical programming unit usually includes a data bit area and a redundancy bit area. The data bit area has multiple physical sectors configured to store user data, and the redundant bit area is configured to store system data (e.g., an error correcting code). In the present exemplary embodiment, each of the data bit areas contains 32 physical sectors, and a size of each physical sector is 512-byte (B). However, in other exemplary embodiments, the data bit area may also include 8, 16, or more or less of the physical sectors, and amount and sizes of the physical sectors are not limited in the invention.

In the present exemplary embodiment, a rewritable non-volatile memory module 106 is a Multi Level Cell (MLC) NAND flash memory module which stores at least 2 bits in one cell. The rewritable non-volatile memory module 106 may also be a Single Level Cell (SLC) NAND flash memory module, a Trinary Level Cell (TLC) NAND flash memory module, other flash memory modules or any memory module having the same features.

Figure 5:
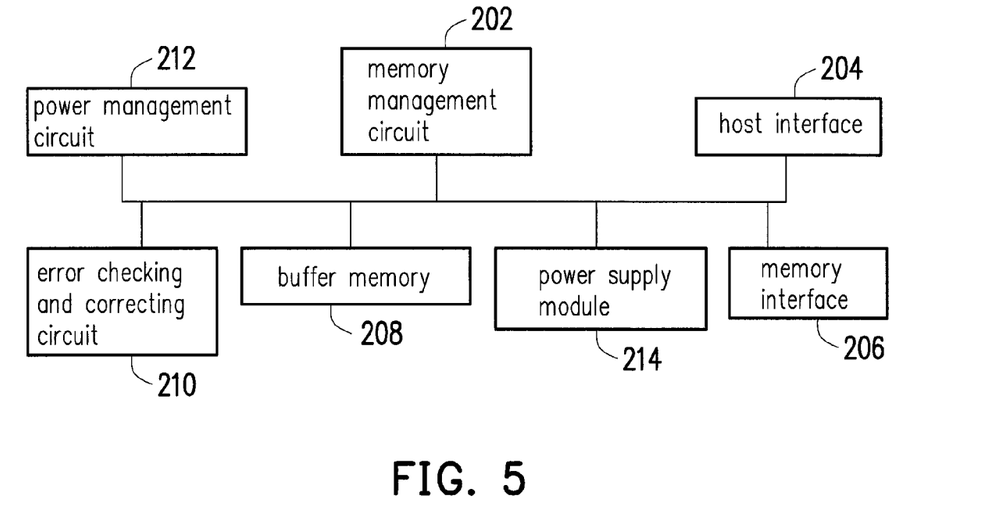
FIG. 5 is a schematic block diagram illustrating a memory control circuit unit according to an exemplary embodiment of the invention.

FIG. 5 is a schematic block diagram illustrating a memory control circuit unit according to an exemplary embodiment of the invention.

Referring to FIG. 5, the memory control circuit unit 104 includes a memory management circuit 202, a host interface 204 and a memory interface 206.

The memory management circuit 202 is configured to control overall operations of the memory control circuit unit 104. Specifically, the memory management circuit 202 has a plurality of control commands. During operations of the memory storage device 100, the control commands are executed to perform various operations such as writing, reading and erasing data. Operations of the memory management circuit 202 are similar to the operations of the memory control circuit unit 104, thus related description is omitted hereinafter.

In the present exemplary embodiment, the control commands of the memory management circuit 202 are implemented in a form of a firmware. For instance, the memory management circuit 202 has a microprocessor unit (not illustrated) and a ROM (not illustrated), and the control commands are burned into the ROM. When the memory storage device 100 operates, the control commands are executed by the microprocessor to perform operations of writing, reading or erasing data.

In another exemplary embodiment, the control commands of the memory management circuit 202 may also be stored as program codes in a specific area (for example, the system area in a memory exclusively used for storing system data) of the rewritable non-volatile memory module 106. In addition, the memory management circuit 202 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 106 to the RAM of the memory management circuit 202 when the memory control circuit unit 104 is enabled. Next, the control commands are executed by the microprocessor unit to perform operations of writing, reading or erasing data.

Further, in another exemplary embodiment, the control commands of the memory management circuit 202 may also be implemented in a form of hardware. For example, the memory management circuit 202 includes a microcontroller, a memory writing unit, a memory reading unit, a memory erasing unit and a data processing unit. The memory management unit, the memory writing unit, the memory reading unit, the memory erasing unit and the data processing unit are coupled to the microprocessor. The memory management unit is configured to manage the physical erasing units of the rewritable non-volatile memory module 106; the memory writing unit is configured to issue a write command to the rewritable non-volatile memory module 106 in order to write data to the rewritable non-volatile memory module; the memory reading unit is configured to issue a read command to the rewritable non-volatile memory module 106 in order to read data from the rewritable non-volatile memory module 106; the memory erasing unit is configured to issue an erase command to the rewritable non-volatile memory module 106 in order to erase data from the rewritable non-volatile memory module 106; the data processing unit is configured to process both the data to be written to the rewritable non-volatile memory module 106 and the data to be read from the rewritable non-volatile memory module 106.

The host interface 204 is coupled to the memory management circuit 202 and configured to receive and identify commands and data sent from the host system 1000. Namely, the commands and data sent from the host system 1000 are passed to the memory management circuit 202 through the host interface 204. In the present exemplary embodiment, the host interface 204 is compatible to a SATA standard. However, it should be understood that the present invention is not limited thereto, and the host interface 204 may also be compatible with a PATA standard, an IEEE 1394 standard, a PCI Express standard, a USB standard, a SD standard, a UHS-I standard, a UHS-II standard, a MS standard, a MMC standard, a eMMC standard, a UFS standard, a CF standard, an IDE standard, or other suitable standards for data transmission.

The memory interface 206 is coupled to the memory management circuit 202 and configured to access the rewritable non-volatile memory module 106. That is, data to be written to the rewritable non-volatile memory module 106 is converted to a format acceptable to the rewritable non-volatile memory module 106 through the memory interface 206.

In an exemplary embodiment, the memory control circuit unit 104 further includes a buffer memory 208, an error checking and correcting circuit 210, a power management circuit 212 and a power supply module 214.

The buffer memory 208 is coupled to the memory management circuit 202 and configured to temporarily store data and commands from the host system 1000 or data from the rewritable non-volatile memory module 106.

The error checking and correcting circuit 210 is coupled to the memory management circuit 202 and configured to perform an error checking and correcting process to ensure the correctness of data. Specifically, when the memory management circuit 202 receives a write command from the host system 1000, the error checking and correcting circuit 210 generates an error correcting code (ECC code) for data corresponding to the write command, and the memory management circuit 202 writes data and the ECC code corresponding to the write command to the rewritable non-volatile memory module 106. Subsequently, when the memory management circuit 202 reads the data from the rewritable non-volatile memory module 106, the ECC code corresponding to the data is also read, and the error checking and correcting circuit 210 may execute the error checking and correcting procedure for the read data according to the ECC code.

The power management circuit 212 is coupled to the memory management circuit 202 and configured to control a power of the memory storage device 100. In the present exemplary embodiment, the power management circuit 212 may be used to control a power supply module 214. In another exemplary embodiment, the power management circuit 212 may also be disposed in the power supply module 214.

The power supply module 214 is coupled to any electronic components or circuits in the memory storage device 100 which require power to operate, such as the memory management circuit 202, the host interface 204, the memory interface 206, the buffer memory 208, the error checking and correcting circuit 210, the power management circuit 212 and the rewritable non-volatile memory module 106. The power supply module 214 is responsible for supplying power to afore-said electronic components or circuits. It should be specially noted that, FIG. 5 is only used to roughly illustrate a coupling relation between main circuits/components in the memory storage device 100, and other electronic components may be connected between the main circuits/components in series/parallel, which are not particularly limited by the invention.

The memory management circuit 202 is a core circuit of the memory control circuit unit 104. In the present exemplary embodiment, when the memory storage device 100 is operating normally, an operating voltage of the memory management circuit 202 is 1.1 volt, and operating voltages of the host interface 204, the memory interface 206 and the rewritable non-volatile memory module 106 are 3.3 volt. In other words, in the present exemplary embodiment, when the memory storage device 100 is operating normally, a potential difference between a power input terminal of the memory management circuit 202 and a reference voltage terminal of the memory management circuit 202 is 1.1 volt; a potential difference between a power input terminal of the host interface 204 and a reference voltage terminal of the host interface 204 is 3.3 volt; a potential difference between a power input terminal of the memory interface 206 and a reference voltage terminal of the memory interface 206 is 3.3 volt; and a potential difference between a power input terminal of the rewritable non-volatile memory module 106 and a reference voltage terminal of the rewritable non-volatile memory module 106 is 3.3 volt. However, in another exemplary embodiment, the operating voltage for each of the electronic components or circuits in the memory storage device 100 may be adjusted or regulated based on practical demands, which is not limited by the invention.

Generally, the operating voltages of the electronic components or circuits in the memory storage device or any electronic system may be different from one another. Therefore, a power voltage came from city power or batteries is first processed by step-up/step-down and/or rectification of at least one voltage adjusting circuit (e.g., a step-up/step-down/rectification circuit) before being provided to the electronic components or circuits. Therein, one voltage adjusting circuit may provide a power voltage having a voltage value. The electronic components or circuits having the same operating voltage are usually coupled between the same voltage adjusting circuit and one or more grounding components in a manner of parallel connection. For example, the host interface, the memory interface and the rewritable non-volatile memory module all having the operating voltage of 3.3 volt are connected between the same voltage adjusting circuit and the one or more grounding components in parallel, wherein the voltage adjusting circuit is responsible for lowering the power voltage to 3.3 voltage before outputting the same to the host interface, the memory interface and the rewritable non-volatile memory module. In addition, the memory management circuit having the operating voltage of 1.1 volt is usually coupled between another voltage adjusting circuit and one or more grounding components solely or in parallel with other electronic components or circuits, wherein said voltage adjusting circuit is responsible for lowering the power voltage to 1.1 volt before outputting the same to the memory management circuit. Accordingly, usage efficiency for each voltage adjusting circuit may be improved, and circuit areas may also be reduced.

However, afore-said coupling method may cause generation of a large amount of heat when the voltage adjusting circuit coupled to the memory management circuit is lowering the power voltage to the operating voltage (e.g., 1.1 volt) of the memory management circuit. Particularly, for a linear voltage adjusting circuit that converts lowered voltage into heat, afore-said coupling method may cause problems such as overheat, damages to software/hardware, or reduction in effective utilization of power to the memory control circuit unit 104 or the memory storage device 100.

The exemplary embodiment of the invention is capable of effectively improving above-mentioned problems by coupling a reference voltage terminal of the memory interface circuit to a power input terminal of the memory management circuit.

Figure 6:
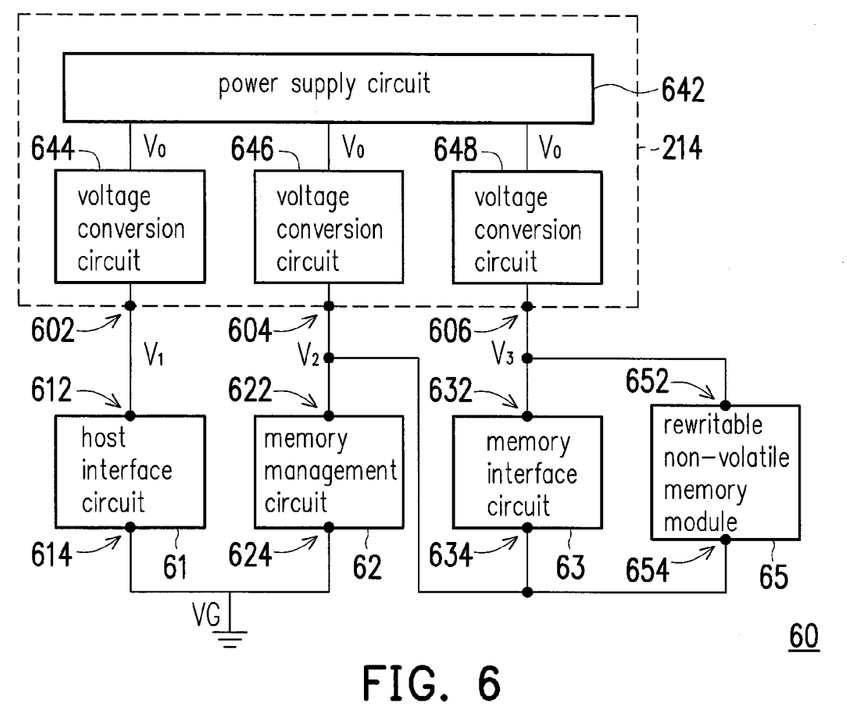
FIG. 6 is a schematic diagram illustrating a power supply system according to an exemplary embodiment of the invention.

FIG. 6 is a schematic diagram illustrating a power supply system according to an exemplary embodiment of the invention.

Referring to FIG. 6, in the present exemplary embodiment, a power supply system 60 includes a host interface circuit 61, a memory management circuit 62, a memory interface circuit 63 and the power supply module 214.

The host interface circuit 61 may be the host interface 204, or a part of circuits in the host interface 204. The memory management circuit 62 may be the memory management circuit 202, or a part of circuits in the memory management circuit 202. The memory interface circuit 63 may be the memory interface 206, or a part of circuits in the memory interface 206.

In the present exemplary embodiment, the power supply module 214 includes a power output terminal 602, a power output terminal 604 and a power output terminal 606. In the present exemplary embodiment, the power output terminal 602 is also known as a first power output terminal, the power output terminal 604 is also known as a second power output terminal, and the power output terminal 606 is also known as a third power output terminal. The power output terminal 602 is coupled to a power input terminal 612 of the host interface circuit 61, the power output terminal 604 is coupled to a power input terminal 622 of the memory management circuit 62, and the power output terminal 606 is coupled to a power input terminal 632 of the memory interface circuit 63. The power supply module 214 provides power required for operation to the host interface circuit 61, the memory management circuit 62 and the memory interface circuit 63 respectively through the power input terminal 612, the power input terminal 622 and the power input terminal 632.

A reference voltage terminal 614 of the host interface circuit 61 and a reference voltage terminal 624 of the memory management circuit 62 are coupled to a grounding terminal. Herein, the grounding terminal is configured to provide a grounding voltage VG (e.g., 0 volt), thus the grounding terminal, the reference voltage terminal 614 and the reference voltage terminal 624 include the same grounding voltage VG. Particularly, in the present exemplary embodiment, a reference voltage terminal 634 of the memory interface circuit 63 is not coupled to the grounding terminal but coupled to the power input terminal 622 of the memory management circuit 62 instead. Therefore, the reference voltage terminal 634 does not have the grounding voltage VG but has a voltage value identical to that of the power input terminal 622 of the memory management circuit 62 instead.

In the present exemplary embodiment, the power supply module 214 further includes a power supply circuit 642, a voltage conversion circuit 644, a voltage conversion circuit 646 and a voltage conversion circuit 648. In the present exemplary embodiment, the voltage conversion circuit 644 is also known as a first voltage conversion circuit, the voltage conversion circuit 646 is also known as a second voltage conversion circuit, and the voltage conversion circuit 648 is also known as a third voltage conversion circuit.

The power supply circuit 642 is configured to provide an initial power voltage $V_0$. For example, the initial power voltage $V_0$ may be obtained by converting the power came from city power or batteries by the power supply circuit 642. In the present exemplary embodiment, the initial power voltage $V_0$ is 5 volt, but the invention is not limited thereto.

The voltage conversion circuit 644 is coupled between the power supply circuit 642 and the power output terminal 602, and configured to convert the initial power voltage $V_0$ into a power voltage $V_1$. In the present exemplary embodiment, the power voltage $V_1$ is 3.3 volt, but the invention is not limited thereto.

The voltage conversion circuit 646 is coupled between the power supply circuit 642 and the power output terminal 604, and configured to convert the initial power voltage $V_0$ into a power voltage $V_2$. In the present exemplary embodiment, the power voltage $V_2$ is 1.1 volt, but the invention is not limited thereto.

The voltage conversion circuit 648 is coupled between the power supply circuit 642 and the power output terminal 606, and configured to convert the initial power voltage $V_0$ into a power voltage $V_3$. In the present exemplary embodiment, the power voltage $V_3$ is 4.4 volt, but the invention is not limited thereto.

In the present exemplary embodiment, the power supply circuit 642, the voltage conversion circuit 644, the voltage conversion circuit 646 and the voltage conversion circuit 648 each may include one or more rectification circuits, one or more step-down circuits and/or one or more step-up circuits, but the invention is not limited thereto. Moreover, in an exemplary embodiment, each of the voltage conversion circuit 644, the voltage conversion circuit 646 and the voltage conversion circuit 648 each may also be considered as one linear regulator.

Voltage values of the initial power voltage $V_0$, the power voltage $V_1$, the power voltage $V_2$ and the power voltage $V_3$ are different from one another. For example, in the present exemplary embodiment, the voltage value of the initial power voltage $V_0$ is greater than the voltage value of the power voltage $V_3$, the voltage value of the power voltage $V_3$ is greater than the voltage value of the power voltage $V_1$, and the voltage value of the power voltage $V_1$ is greater than the voltage value of the power voltage $V_2$. Particularly, in an exemplary embodiment, the voltage value of the power voltage $V_3$ is equal to a total of the voltage values of the power voltage $V_1$ and the power voltage $V_2$. However, in another exemplary embodiment, value relations between the voltage values of the initial power voltage $V_0$, the power voltage $V_1$, the power voltage $V_2$ and the power voltage $V_3$ may also be adjusted based on demands instead of being limited to the above.

In the present exemplary embodiment, the power supply module 214 is configured to provide the power voltage $V_1$ to the power input terminal 612 of the host interface circuit 61, provide the power voltage $V_2$ to the power input terminal 622 of the memory management circuit 62, and provide the power voltage $V_3$ to the power input terminal 632 of the memory interface circuit 63, so as to maintain normal operations of the host interface circuit 61, the memory management circuit 62 and the memory interface circuit 63. In other words, when the power supply module 214 is operating normally, voltage values of the power output terminal 602 and the power input terminal 612 are the voltage value of the power voltage $V_1$, voltage values of the power output terminal 604 and the power input terminal 622 are the voltage value of the power voltage $V_2$, and voltage values of the power output terminal 606 and the power input terminal 632 are the voltage value of the power voltage $V_3$. Furthermore, in the present exemplary embodiment, the power voltage $V_1$ is also known as a first power voltage, the power voltage $V_2$ is also known as a second power voltage, and the power voltage $V_3$ is also known as a third power voltage.

In the present exemplary embodiment, the potential difference between the power input terminal 612 and the reference voltage terminal 614 (e.g., $V_1$–VG) is equal to the voltage value of the power voltage $V_1$ (e.g., 3.3 volt), and thus the power voltage $V_1$ is the operating voltage of the host interface circuit 61; the potential difference between the power input terminal 622 and the reference voltage terminal 624 (e.g., $V_2$–VG) is equal to the voltage value of the power voltage $V_2$ (e.g., 1.1 volt) and thus the power voltage $V_2$ is the operating voltage of the memory management circuit 62; and the potential difference between the power input terminal 632 and the reference voltage terminal 634 (e.g., $V_3$–$V_2$) is not equal to the voltage value of the power voltage $V_3$ (e.g., 4.4 volt), and thus the power voltage $V_3$ is not the operating voltage of the memory interface circuit 63. In other words, the operating voltage of the memory interface circuit 63 is the potential difference between the power input terminal 632 and the reference voltage terminal 634 (e.g., $V_3$–$V_2$=4.4–1.1=3.3 volt). Alternatively, from another perspective, a first potential difference (e.g., $V_3$–VG) is provided between the power input terminal 632 and the grounding terminal, a second potential difference (e.g., $V_3$–$V_2$) is provided between the power input terminal 632 and the reference voltage terminal 634, and the first potential difference is greater than the second potential difference.

Particularly, in the present exemplary embodiment, an output current of the memory interface circuit 63 may be directed through the reference voltage terminal 634 into the power input terminal 622 of the memory management circuit 62, so as to reduce an amount of currents flowed through the voltage conversion circuit 646, and reduce heat radiated from the voltage conversion circuit 646 or the memory storage device 100.

In an exemplary embodiment, the power supply system 60 further includes a rewritable non-volatile memory module 65. The rewritable non-volatile memory module 65 may be the rewritable non-volatile memory module 106, or a part of circuits in the rewritable non-volatile memory module 106.

Figure 7:
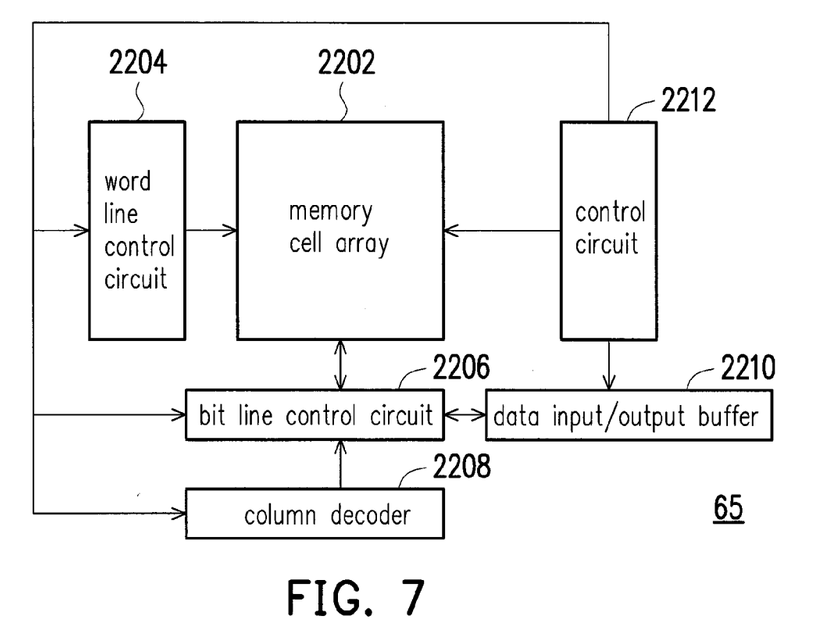
FIG. 7 is a schematic block diagram illustrating a rewritable non-volatile memory module according to an exemplary embodiment of the invention.

FIG. 7 is a schematic block diagram illustrating a rewritable non-volatile memory module according to an exemplary embodiment of the invention.

Referring to FIG. 7, the rewritable non-volatile memory module 65 includes a memory cell array 2202, a word line control circuit 2204, a bit line control circuit 2206, a column decoder 2208, a data input-output buffer 2210 and a control circuit 2212.

The memory cell array 2202 includes the physical erasing units 410(0) to 410(N) in FIG. 4. Memory cells in the memory cell array 2202 are disposed at intersections of a plurality of bit lines and a plurality of word lines in arrays. In case a write command or a read command is received from the memory control circuit unit 104, the control circuit 2212 controls the word line control circuit 2204, the bit line control circuit 2206, the column decoder 2208, the data input-output buffer 2210 to write the data in the memory cell array 2202 or read the data from the memory cell array 2202. In addition, the word line control circuit 2204 is configured to control voltages applied to the word lines; the bit line control circuit 2206 is configured to control voltages applied to the bit lines; the column decoder 2208 is configured to select the corresponding bit line according to a decoding row address in a command; and the data input-output buffer 2210 is configured to temporarily store the data. Moreover, the rewritable non-volatile memory module 65 may further include more or less of the electronic components or circuits, which are not particularly limited by the invention.

Referring back to FIG. 6, in an exemplary embodiment of FIG. 6, the power output terminal 606 is further coupled to a power input terminal 652 of the rewritable non-volatile memory module 65, and a reference voltage terminal 654 of the rewritable non-volatile memory module 65 is coupled to the power input terminal 622 of the memory management circuit 62. The power supply module 214 may provide the power supply $V_3$ to the power input terminal 652 of the rewritable non-volatile memory module 65, so as to maintain normal operations of each of the electronic components or circuits in the rewritable non-volatile memory module 65. As similar to that of the memory interface circuit 63, a potential difference between the power input terminal 652 and the reference voltage terminal 654 (e.g., $V_3$–$V_2$) is not equal to the voltage value of the voltage value $V_3$ (e.g., 4.4 volt), and thus the power voltage $V_3$ is not the operating voltage of the rewritable non-volatile memory module 65. In other words, the operating voltage of the rewritable non-volatile memory module 65 is the potential difference between the power input terminal 652 and the reference voltage terminal 654 (e.g., $V_3$–$V_2$=4.4–1.1=3.3 volt). Alternatively, from another perspective, said first potential difference (e.g., $V_3$–VG) is provided between the power input terminal 652 and the grounding terminal, said second potential difference (e.g., $V_3$–$V_2$) is provided between the power input terminal 652 and the reference voltage terminal 654, and the first potential difference is greater than the second potential difference.

Particularly, in the present exemplary embodiment, output currents of the memory interface circuit 63 and the rewritable non-volatile memory module 65 may be directed respectively through the reference voltage terminal 634 and the reference voltage terminal 654 into the power input terminal 622 of the memory management circuit 62, so as to further reduce the amount of currents flowed through the voltage conversion circuit 646, and reduce heat radiated from the voltage conversion circuit 646 or the memory storage device 100.

Figure 8:
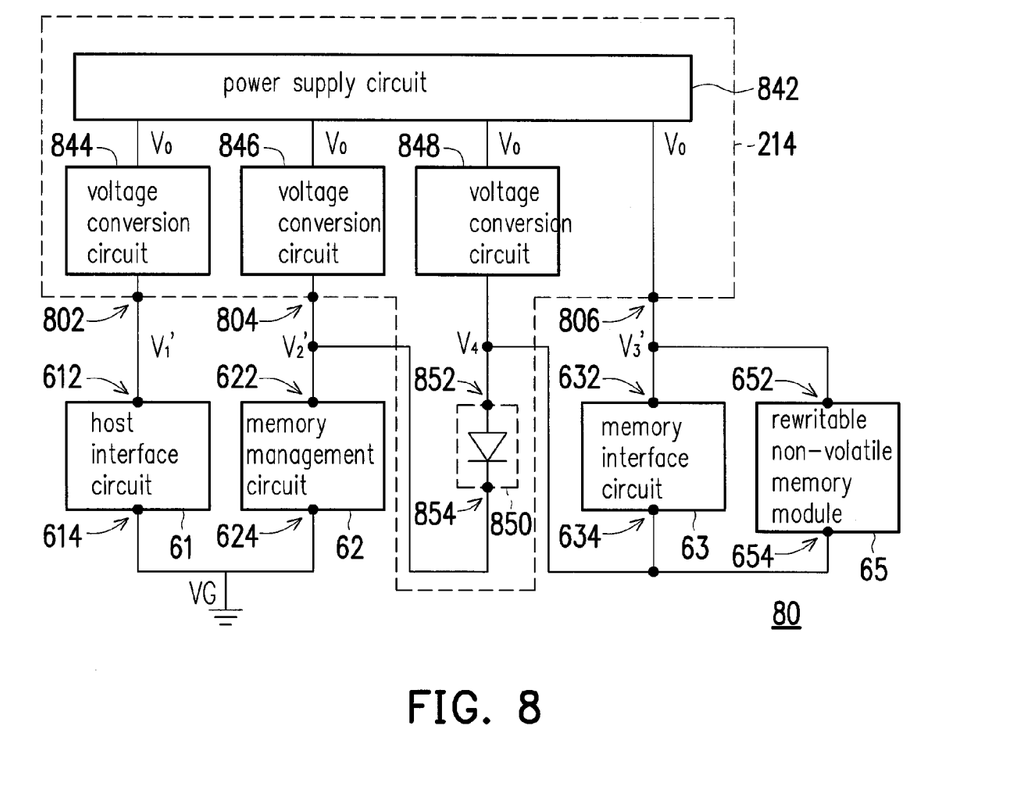
FIG. 8 is a schematic diagram illustrating a power supply system according to another exemplary embodiment of the invention.

FIG. 8 is a schematic diagram illustrating a power supply system according to another exemplary embodiment of the invention.

Referring to FIG. 8, in the present exemplary embodiment, a power supply system 80 includes a host interface circuit 61, a memory management circuit 62, a memory interface circuit 63 and the power supply module 214. The host interface circuit 61, the memory management circuit 62 and the memory interface circuit 63 are identical or similar to the host interface circuit 61, the memory management circuit 62 and the memory interface circuit 63 in FIG. 6, respectively, and thus related descriptions are not repeated hereinafter.

In the present exemplary embodiment, the power supply module 214 includes a power output terminal 802, a power output terminal 804 and a power output terminal 806. In the present exemplary embodiment, the power output terminal 802 is also known as a first power output terminal, the power output terminal 804 is also known as a second power output terminal, and the power output terminal 806 is also known as a third power output terminal. The power output terminal 802 is coupled to a power input terminal 612 of the host interface circuit 61, the power output terminal 804 is coupled to a power input terminal 622 of the memory management circuit 62, and the power output terminal 806 is coupled to a power input terminal 632 of the memory interface circuit 63. The power supply module 214 provides power required for operation to the host interface circuit 61, the memory management circuit 62 and the memory interface circuit 63 respectively through the power input terminal 612, the power input terminal 622 and the power input terminal 632.

As similar to the exemplary embodiment of FIG. 6, a reference voltage terminal 614 of the host interface circuit 61 and a reference voltage terminal 624 of the memory management circuit 62 are coupled to a grounding terminal. Herein, the grounding terminal is configured to provide a grounding voltage VG (e.g., 0 volt). Further, in the present exemplary embodiment, a reference voltage terminal 634 of the memory interface circuit 63 is not coupled to the grounding terminal but indirectly coupled to the power input terminal 622 of the memory management circuit 62 instead. Therefore, the reference voltage terminal 634 does not have the grounding voltage VG, and a voltage value of the reference voltage terminal 634 is different from the voltage value of the power input terminal 622 of the memory management circuit 62. For example, in the present exemplary embodiment, the voltage value of the reference voltage terminal 634 is higher than the voltage value of the power input terminal 622.

In the present exemplary embodiment, the power supply module 214 further includes a power supply circuit 842, a voltage conversion circuit 844, a voltage conversion circuit 846, a voltage conversion circuit 848 and a voltage conversion circuit 850. In the present exemplary embodiment, the voltage conversion circuit 844 is also known as a first voltage conversion circuit, the voltage conversion circuit 846 is also known as a second voltage conversion circuit, the voltage conversion circuit 848 is also known as a third voltage conversion circuit, and the voltage conversion circuit 850 is also known as a fourth voltage conversion circuit.

The power supply circuit 842 is configured to provide an initial power voltage $V_0$. For example, the initial power voltage $V_0$ may be obtained by converting the power came from city power or batteries by the power supply circuit 842. In the present exemplary embodiment, the initial power voltage $V_0$ is 5 volt, but the invention is not limited thereto.

The voltage conversion circuit 844 is coupled between the power supply circuit 842 and the power output terminal 802, and configured to convert the initial power voltage $V_0$ into a power voltage $V_1'$. In the present exemplary embodiment, the power voltage $V_1'$ is 3.3 volt, but the invention is not limited thereto.

The voltage conversion circuit 846 is coupled between the power supply circuit 842 and the power output terminal 804, and configured to convert the initial power voltage $V_0$ into a power voltage $V_2'$. In the present exemplary embodiment, the power voltage $V_2'$ is 1.1 volt, but the invention is not limited thereto.

The voltage conversion circuit 848 is coupled to the power supply circuit 842, and configured to convert the initial power voltage $V_0$ into a power voltage $V_4$. In the present exemplary embodiment, the power voltage $V_4$ is 1.8 volt, but the invention is not limited thereto.

The voltage conversion circuit 850 is coupled between the voltage conversion circuit 848 and the power input terminal 622 of the memory management circuit 62, and configured to convert the power voltage $V_4$ into the power voltage $V_2'$. More specifically, a power input terminal 852 of the voltage conversion circuit 850 is coupled between the voltage conversion circuit 848 and the reference voltage terminal 634 of the memory interface circuit 63, and a power output terminal 854 of the voltage conversion circuit 850 is coupled to the power input terminal 622 of the memory management circuit 62.

In the present exemplary embodiment, the power supply circuit 842, the voltage conversion circuit 844, the voltage conversion circuit 846, the voltage conversion circuit 848 and the voltage conversion circuit 850 each may include one or more rectification circuits, one or more step-down circuits and/or one or more step-up circuits, but the invention is not limited thereto. For example, in the present exemplary embodiment, the voltage conversion circuit 850 is a step-down circuit. As shown in FIG. 8, this step-down circuit may include one or more diodes. Moreover, in an exemplary embodiment, the voltage conversion circuit 844, the voltage conversion circuit 846 and the voltage conversion circuit 848 each may also be considered as one linear regulator.

Voltage values of the initial power voltage $V_0$, the power voltage $V_1'$, the power voltage $V_2'$, the power voltage $V_4$ are different from one another. For example, in the present exemplary embodiment, the voltage value of the initial power voltage $V_0$ is greater than the voltage value of the power voltage $V_1'$, the voltage value of the power voltage $V_1'$ is greater than the voltage value of the power voltage $V_4$, and the voltage value of the power voltage $V_4$ is greater than the voltage value of the power voltage $V_2'$. However, in another exemplary embodiment, value relations between the voltage values of the initial power voltage $V_0$, the power voltage $V_1'$, the power voltage $V_2'$ and the power voltage $V_4$ may also be adjusted based on demands instead of being limited to the above.

In the present exemplary embodiment, the power supply module 214 is configured to provide the power voltage $V_1'$ to the power input terminal 612 of the host interface circuit 61, provide the power voltage $V_2'$ to the power input terminal 622 of the memory management circuit 62, and provide the power voltage $V_3'$ to the power input terminal 632 of the memory interface circuit 63, so as to maintain normal operations of the host interface circuit 61, the memory management circuit 62 and the memory interface circuit 63. Therein, the voltage value of the power voltage $V_3'$ is identical to or almost identical to the voltage value of the power voltage $V_0$. In other words, when the power supply module 214 is operating normally, voltage values of the power output terminal 802 and the power input terminal 612 are the voltage value of the power voltage $V_1'$, voltage values of the power output terminal 804 and the power input terminal 622 are the voltage value of the power voltage $V_2'$, and voltage values of the power output terminal 806 and the power input terminal 632 are the voltage value of the power voltage $V_3'$. Furthermore, in the present exemplary embodiment, the power voltage $V_1'$ is also known as a first power voltage, the power voltage $V_2'$ is also known as a second power voltage, the power voltage $V_3'$ is also known as a third power voltage, and the power voltage $V_4$ is also known as a fourth power voltage.

As similar to the exemplary embodiment of FIG. 6, in the present exemplary embodiment, a first potential difference (e.g., $V_3'$−VG) is provided between the power input terminal 632 and the grounding terminal, a second potential difference (e.g., $V_3'$−$V_4$) is provided between the power input terminal 632 and the reference voltage terminal 634, and the first potential difference is greater than the second potential difference. Particularly, in the present exemplary embodiment, an output current of the memory interface circuit 63 may be directed through the voltage conversion circuit 850 into the power input terminal 622 of the memory management circuit 62, so as to reduce an amount of currents flowed through the voltage conversion circuit 846 and voltage conversion circuit 848, and reduce heat radiated from the memory storage device 100.

In an exemplary embodiment of FIG. 8, the power supply system 80 further includes aforesaid rewritable non-volatile memory module 65. As shown in FIG. 8, the power output terminal 806 is further coupled to a power input terminal 652 of the rewritable non-volatile memory module 65, and a reference voltage terminal 654 of the rewritable non-volatile memory module 65 is indirectly coupled to the power input terminal 622 of the memory management circuit 62 through the voltage conversion circuit 850. For example, the reference voltage terminal 654 is coupled to the power input terminal 652 of the voltage conversion circuit 850. Accordingly, the power supply module 214 may provide the power supply $V_3'$ to the power input terminal 652 of the rewritable non-volatile memory module 65, so as to maintain normal operations of each of the electronic components or circuits in the rewritable non-volatile memory module 65.

As similar to the memory interface circuit 63, in the present exemplary embodiment, aforesaid first potential difference (e.g., $V_3'$–VG) is provided between the power input terminal 652 and the grounding terminal, aforesaid second potential difference, (e.g., $V_3'$–$V_4$) is provided between the power input terminal 652 and the reference voltage terminal 654, and the first potential difference is greater than the second potential difference. Particularly, in the present exemplary embodiment, output currents of the memory interface circuit 63 and the rewritable non-volatile memory module 65 may be directed through the voltage conversion circuit 850 into the power input terminal 622 of the memory management circuit 62, so as to further reduce the amount of currents flowed through the voltage conversion circuit 846 and the voltage conversion circuit 848, and reduce heat radiated from the memory storage device 100.

Figure 9:
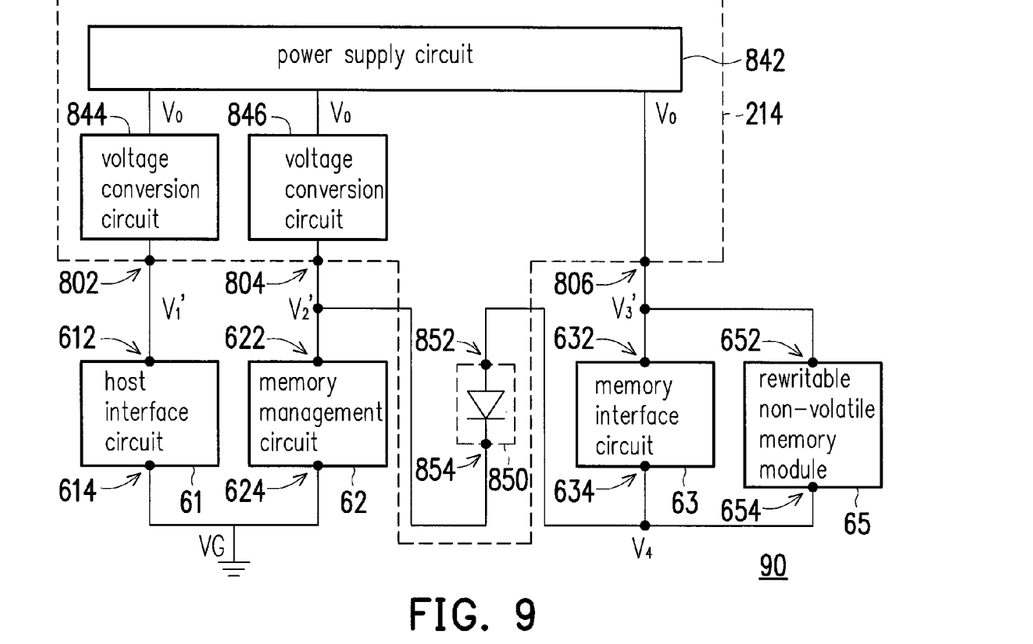
FIG. 9 is a schematic diagram illustrating a power supply system according to another exemplary embodiment of the invention.

FIG. 9 is a schematic diagram illustrating a power supply system according to another exemplary embodiment of the invention.

Referring to FIG. 9, a difference between a power supply system 90 and the power supply system 80 of FIG. 8 is that, the power supply system 90 does not include the voltage conversion circuit 848 of the power supply system 80. As shown in FIG. 9, the voltage conversion circuit 850 is coupled between the reference voltage terminal 634 of the memory interface circuit 63 and the power input terminal 622 of the memory management circuit 62. More specifically, the power input terminal 852 of the voltage conversion circuit 850 is coupled to the reference voltage terminal 634 of the memory interface circuit 63 and/or the reference voltage terminal 654 of the rewritable non-volatile memory module 65, and the power output terminal 854 of the voltage conversion circuit 850 is coupled to the power input terminal 622 of the memory management circuit 62.

It is worth mentioning that, the power supply systems 60, 80 and 90 are mainly used to describe power transmission paths for each of the electronic components or circuits having greater power consumption in the memory storage device 100, whereas a part of the electronic components or circuits for improving electrical properties (such as capacitors and/or resistors) is omitted herein. However, in another exemplary embodiment, any electronic component or circuit may be added to the power supply systems 60, 80 and 90, which are not limited by the invention.

Figure 10:
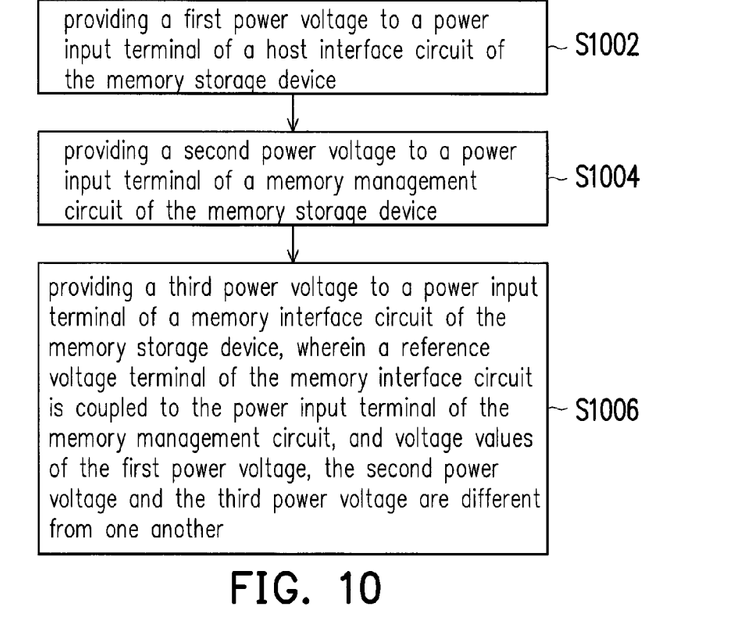
FIG. 10 is a flowchart illustrating a power supply method according to an exemplary embodiment of the invention.

FIG. 10 is a flowchart illustrating a power supply method according to an exemplary embodiment of the invention. Referring to FIG. 10, in step S1002, a first power voltage is provided to a power input terminal of a host interface circuit of the memory storage device. In step S1004, a second power voltage is provided to a power input terminal of a memory management circuit of the memory storage device. In step S1006, a third power voltage is provided to a power input terminal of a memory interface circuit of the memory storage device. Therein, a reference voltage terminal of the memory interface circuit is coupled to the power input terminal of the memory management circuit, and the first power voltage, the second power voltage and the third power voltage are different from one another.

Nevertheless, steps depicted in FIG. 10 are described in detail as above, thus related description is omitted hereinafter. It should be noted that, the steps depicted in FIG. 10 may be implemented as a plurality of program codes or circuits, and the invention is not limited thereto. In addition, the method disclosed in FIG. 10 can be used accompanying each of the foregoing exemplary embodiments, or can be used separately, and the invention is not limited thereto. Moreover, each of the steps in FIG. 10 may be executed simultaneously or executed sequentially, and an executing sequence thereof can also be adaptively adjusted.

In summary, according to the memory storage device, the memory control circuit unit and the power supply method in an exemplary embodiment of the invention, by directing the output current of the memory interface circuit through the reference voltage terminal of the memory interface circuit into the memory management circuit, normal operations of the electronic components or circuits having greater power consumption such as the host interface circuit, the memory management circuit and the memory interface circuit may be maintained while improving the overheat problem of the memory storage device due to the voltage conversion in conventional art.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory storage device, comprising:
   a connection interface unit configured to couple to a host system;
   a rewritable non-volatile memory module comprising a plurality of physical erasing units; and
   a memory control circuit unit coupled to the connection interface unit and the rewritable non-volatile memory module, and the memory control circuit unit comprising:
      a host interface circuit configured to couple to the host system;
      a memory management circuit;
      a memory interface circuit configured to couple to the rewritable non-volatile memory module; and
      a power supply module coupled to the host interface circuit, the memory management circuit and the memory interface circuit,
      wherein the power supply module is configured to provide a first power voltage to a power input terminal of the host interface circuit,
      the power supply module is further configured to provide a second power voltage to a power input terminal of the memory management circuit, and
      the power supply module is further configured to provide a third power voltage to a power input terminal of the memory interface circuit,
      wherein a reference voltage terminal of the memory interface circuit is coupled to the power input terminal of the memory management circuit, and voltage values of the first power voltage, the second power voltage and the third power voltage are different from one another.

2. The memory storage device of claim 1, wherein the power supply module is further coupled to the rewritable non-volatile memory module, the power supply module is further configured to provide the third power voltage to a power input terminal of the rewritable non-volatile memory module, and a reference voltage terminal of the rewritable non-volatile memory module is coupled to the power input terminal of the memory management circuit.

3. The memory storage device of claim 1, wherein the power supply module comprises a first power output terminal, a second power output terminal and a third power output terminal, wherein the first power output terminal is coupled to the power input terminal of the host interface circuit, the second power output terminal is coupled to the power input terminal of the memory management circuit, and the third power output terminal is coupled to the power input terminal of the memory interface circuit.

4. The memory storage device of claim 3, wherein the third power output terminal is further coupled to the power input terminal of the rewritable non-volatile memory module.

5. The memory storage device of claim 3, wherein the power supply module further comprises:

a power supply circuit configured to provide an initial power voltage;

a first voltage conversion circuit coupled between the power supply circuit and the first power output terminal and configured to convert the initial power voltage into the first power voltage;

a second voltage conversion circuit coupled between the power supply circuit and the second power output terminal and configured to convert the initial power voltage into the second power voltage; and a third voltage conversion circuit coupled between the power supply circuit and the third power output terminal and configured to convert the initial power voltage into the third power voltage.

6. The memory storage device of claim 3, wherein the power supply module further comprises:

a power supply circuit configured to provide an initial power voltage, wherein a voltage value of the initial voltage is equal to the voltage value of the third power voltage;

a first voltage conversion circuit coupled between the power supply circuit and the first power output terminal and configured to convert the initial power voltage into the first power voltage;

a second voltage conversion circuit coupled between the power supply circuit and the second power output terminal and configured to convert the initial power voltage into the second power voltage;

a third voltage conversion circuit coupled to the power supply circuit and configured to convert the initial power voltage into a fourth power voltage; and a fourth voltage conversion circuit coupled between the third voltage conversion circuit and the power input terminal of the memory management circuit and configured to convert the fourth power voltage into the second power voltage, wherein the reference voltage terminal of the memory interface circuit is coupled to the power input terminal of the memory management circuit through the fourth voltage conversion circuit.

7. The memory storage device of claim 6, wherein the fourth voltage conversion circuit is a step-down circuit.

8. The memory storage device of claim 3, wherein the power supply module further comprises:

a power supply circuit configured to provide an initial power voltage, wherein a voltage value of the initial voltage is equal to the voltage value of the third power voltage;

a first voltage conversion circuit coupled between the power supply circuit and the first power output terminal and configured to convert the initial power voltage into the first power voltage;

a second voltage conversion circuit coupled between the power supply circuit and the second power output terminal and configured to convert the initial power voltage into the second power voltage; and a step-down circuit, coupled between the reference voltage terminal of the memory interface circuit and the power input terminal of the memory management circuit.

9. The memory storage device of claim 1, wherein a reference voltage terminal of the memory management circuit is coupled to a grounding terminal, a first potential difference is provided between the power input terminal of the memory interface circuit and the grounding terminal, a second potential difference is provided between the power input terminal of the memory interface circuit and the reference voltage terminal of the memory interface circuit, and the first potential difference is greater than the second potential difference.

10. A memory control circuit unit configured to control a rewritable non-volatile memory module, wherein the rewritable non-volatile memory module comprises a plurality of physical erasing units, and the memory control circuit unit comprises:

a host interface circuit configured to couple to a host system;

a memory management circuit;

a memory interface circuit configured to couple to the rewritable non-volatile memory module; and a power supply module coupled to the host interface circuit, the memory management circuit and the memory interface circuit, wherein the power supply module is configured to provide a first power voltage to a power input terminal of the host interface circuit, the power supply module is further configured to provide a second power voltage to a power input terminal of the memory management circuit, and the power supply module is further configured to provide a third power voltage to a power input terminal of the memory interface circuit, wherein a reference voltage terminal of the memory interface circuit is coupled to the power input terminal of the memory management circuit, and voltage values of the first power voltage, the second power voltage and the third power voltage are different from one another.

11. The memory control circuit unit of claim 10, wherein the power supply module is further coupled to the rewritable non-volatile memory module, the power supply module is further configured to provide the third power voltage to a power input terminal of the rewritable non-volatile memory module, and a reference voltage terminal of the rewritable non-volatile memory module is coupled to the power input terminal of the memory management circuit.

12. The memory control circuit unit of claim 10, wherein the power supply module comprises a first power output terminal, a second power output terminal and a third power output terminal, wherein the first power output terminal is coupled to the power input terminal of the host interface circuit, the second power output terminal is coupled to the power input terminal of the memory management circuit, and the third power output terminal is coupled to the power input terminal of the memory interface circuit.

13. The memory control circuit unit of claim 12, wherein the third power output terminal is further coupled to the power input terminal of the rewritable non-volatile memory module.

14. The memory control circuit unit of claim 12, wherein the power supply module further comprises:
- a power supply circuit configured to provide an initial power voltage;
- a first voltage conversion circuit coupled between the power supply circuit and the first power output terminal and configured to convert the initial power voltage into the first power voltage;
- a second voltage conversion circuit coupled between the power supply circuit and the second power output terminal and configured to convert the initial power voltage into the second power voltage; and
- a third voltage conversion circuit coupled between the power supply circuit and the third power output terminal and configured to convert the initial power voltage into the third power voltage.

15. The memory control circuit unit of claim 12, wherein the power supply module further comprises:
- a power supply circuit configured to provide an initial power voltage, wherein a voltage value of the initial voltage is equal to the voltage value of the third power voltage;
- a first voltage conversion circuit coupled between the power supply circuit and the first power output terminal and configured to convert the initial power voltage into the first power voltage;
- a second voltage conversion circuit coupled between the power supply circuit and the second power output terminal and configured to convert the initial power voltage into the second power voltage;
- a third voltage conversion circuit coupled to the power supply circuit and configured to convert the initial power voltage into a fourth power voltage; and
- a fourth voltage conversion circuit coupled between the third voltage conversion circuit and the power input terminal of the memory management circuit and configured to convert the fourth power voltage into the second power voltage, wherein the reference voltage terminal of the memory interface circuit is coupled to the power input terminal of the memory management circuit through the fourth voltage conversion circuit.

16. The memory control circuit unit of claim 15, wherein the fourth voltage conversion circuit is a step-down circuit.

17. The memory control circuit unit of claim 12, wherein the power supply module further comprises:
- a power supply circuit configured to provide an initial power voltage, wherein a voltage value of the initial voltage is equal to the voltage value of the third power voltage;
- a first voltage conversion circuit coupled between the power supply circuit and the first power output terminal and configured to convert the initial power voltage into the first power voltage;
- a second voltage conversion circuit coupled between the power supply circuit and the second power output terminal and configured to convert the initial power voltage into the second power voltage; and
- a step-down circuit, coupled between the reference voltage terminal of the memory interface circuit and the power input terminal of the memory management circuit.

18. The memory control circuit unit of claim 10, wherein a reference voltage terminal of the memory management circuit is coupled to a grounding terminal,
- a first potential difference is provided between the power input terminal of the memory interface circuit and the grounding terminal, a second potential difference is provided between the power input terminal of the memory interface circuit and the reference voltage terminal of the memory interface circuit, and the first potential difference is greater than the second potential difference.

19. A power supply method for a memory storage device comprising a rewritable non-volatile memory module having a plurality of physical erasing units, and the power supply method comprising:
- providing a first power voltage to a power input terminal of a host interface circuit of the memory storage device;
- providing a second power voltage to a power input terminal of a memory management circuit of the memory storage device; and
- providing a third power voltage to a power input terminal of a memory interface circuit of the memory storage device,
wherein a reference voltage terminal of the memory interface circuit is coupled to the power input terminal of the memory management circuit, and voltage values of the first power voltage, the second power voltage and the third power voltage are different from one another.

20. The power supply method of claim 19, further comprising:
- providing the third power voltage to a power input terminal of the rewritable non-volatile memory module, wherein a reference voltage terminal of the rewritable non-volatile memory module is coupled to the power input terminal of the memory management circuit.

21. The power supply method of claim 19, wherein the reference voltage terminal of the memory interface circuit is coupled to the power input terminal of the memory management circuit through a voltage conversion circuit.

22. The power supply method of claim 19, wherein a reference voltage terminal of the memory management circuit is coupled to a grounding terminal,
- a first potential difference is provided between the power input terminal of the memory interface circuit and the grounding terminal, a second potential difference is provided between the power input terminal of the memory interface circuit and the reference voltage terminal of the memory interface circuit, and the first potential difference is greater than the second potential difference.

* * * * *